United States Patent [19]

Hattori

[11] Patent Number: 5,164,012
[45] Date of Patent: Nov. 17, 1992

[54] HEAT TREATMENT APPARATUS AND METHOD OF FORMING A THIN FILM USING THE APPARATUS

[75] Inventor: Hisashi Hattori, Tama, Japan

[73] Assignee: Tokyo Electron Limited, Tokyo, Japan

[21] Appl. No.: 635,209

[22] Filed: Dec. 28, 1990

[30] Foreign Application Priority Data

Jan. 12, 1990 [JP] Japan .................... 2-4921

[51] Int. Cl.⁵ ............................... C23C 16/46
[52] U.S. Cl. ............................ 118/725; 118/715
[58] Field of Search ..................... 118/715, 725

[56] References Cited

U.S. PATENT DOCUMENTS

| | | | |
|---|---|---|---|
| 4,108,106 | 8/1978 | Dozier | 118/715 |
| 4,593,644 | 6/1986 | Hanak | 118/723 |
| 4,992,301 | 2/1991 | Shishiguchi | 118/724 |

*Primary Examiner*—Richard Bueker
*Attorney, Agent, or Firm*—Oblon, Spivak, McClelland, Maier & Neustadt

[57] ABSTRACT

A heat treatment apparatus having a reaction furnace including a reaction chamber for accommodating a plurality of objects, major surfaces of which are faced to each other at intervals, and a heater provided outside the reaction chamber, gas supply tube for introducing a gas into the reaction chamber therethrough, flow-directing unit for directing gas flow in a first direction substantially parallel to the surfaces of the objects, gas exhaust tube for exhausting a gas outside the reaction chamber, and moving unit for moving the gas flow in a second direction different from the first direction. A method of forming thin films on objects of heat treatment having the steps of causing a first gas flow introduced from a first gas supply tube and a second gas flow introduced from a second gas supply tube to meet each other, thereby producing a third gas flow flowing in a direction substantially parallel to the surfaces of the objects, major surfaces of which are faced to each other at intervals, disposed in a reaction chamber, and controlling flow rate of the first and second gas flows, thereby moving the position of the third gas flow in a second direction different from the first direction.

10 Claims, 8 Drawing Sheets

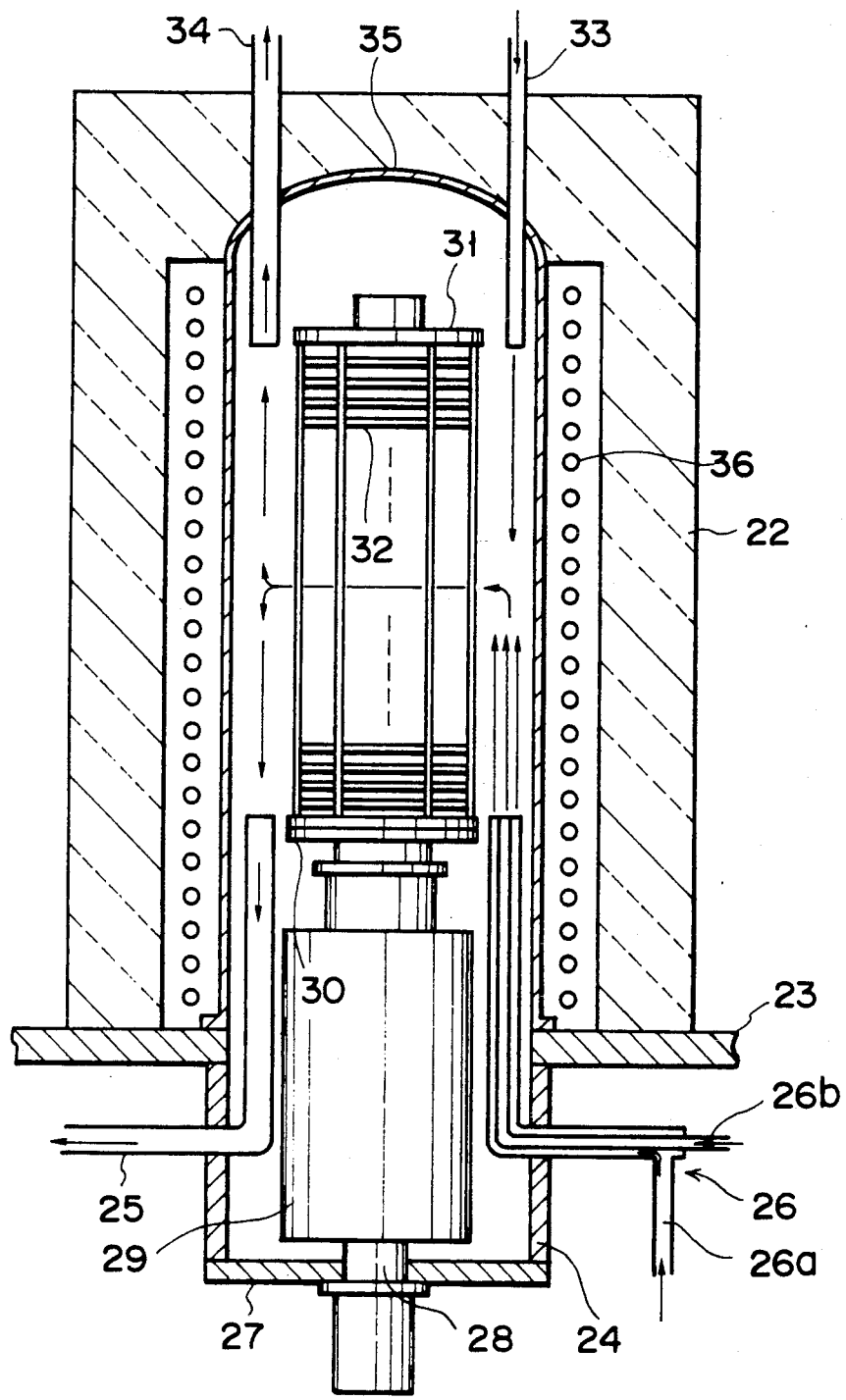
F I G. 2

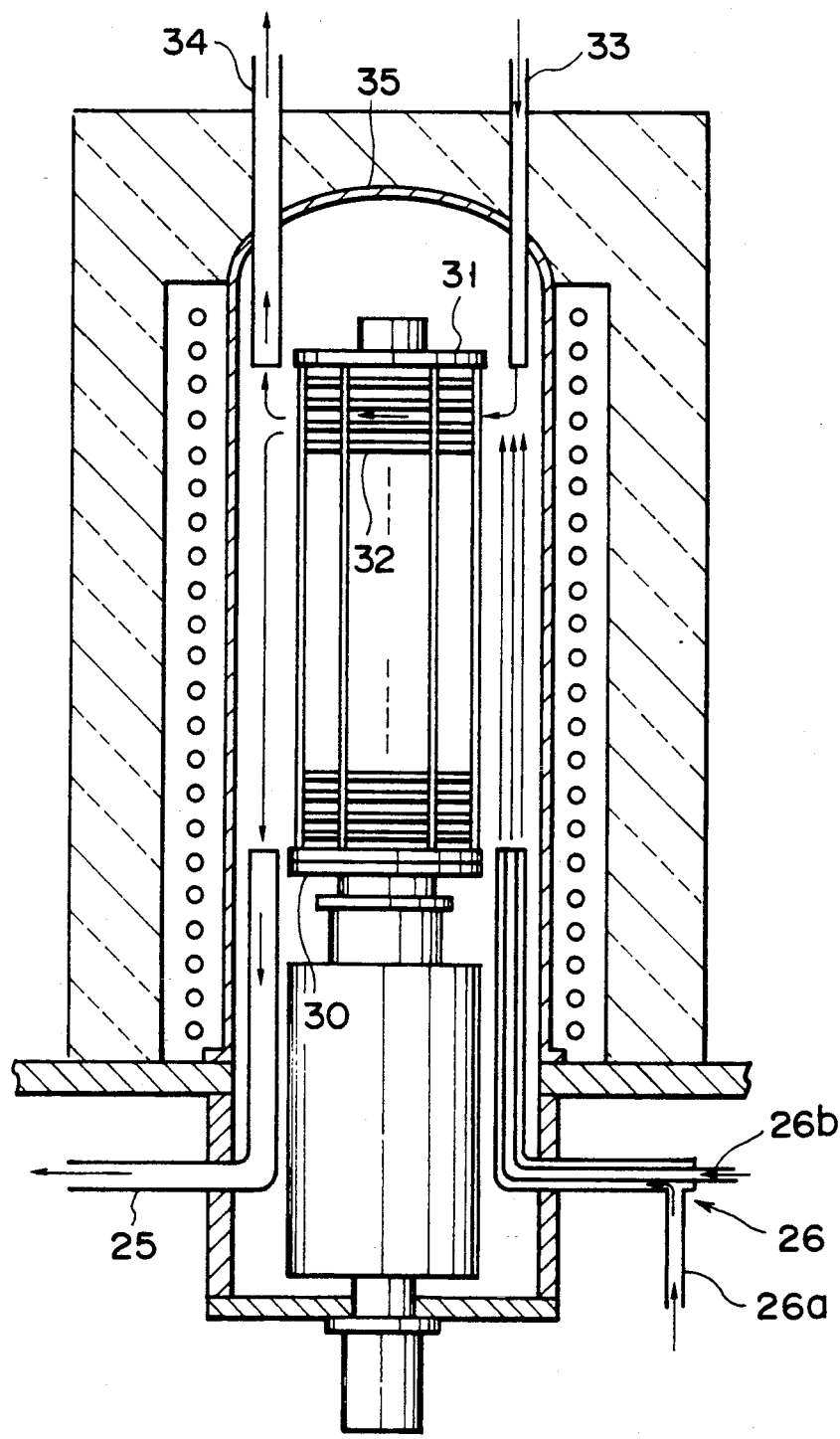
F I G. 5A

HEAT TREATMENT APPARATUS AND METHOD OF FORMING A THIN FILM USING THE APPARATUS

BACKGROUND OF THE INVENTION

1. Field of the Invention

This invention relates to a heat treatment apparatus, and more particularly to a heat treatment apparatus which can uniformly supply a reaction gas to objects. This invention also relates to a method of forming thin films having a uniform thickness on objects by using a heat treatment apparatus.

2. Description of the Related Art

Recent years, heat treatment apparatuses have been used in a film forming step and a thermal diffusion step for manufacturing a semiconductor device. In a heat treatment apparatus, a plurality of semiconductor wafers are stacked horizontally at regular intervals and arranged vertically on a wafer boat, and processed in batches. With this heat treatment apparatus, a semiconductor wafer can be easily disposed, the space and the energy can be saved, and a semiconductor wafers having a large diameter can be processed easily.

When thin films such as an Si epitaxial growth film are formed on a plurality of wafers disposed on a wafer boat, it is required that a thin film formed on a semiconductor wafer have a uniform thickness and the film on each wafer has the same thickness. For this purpose, it is necessary to supply a reaction gas uniformly to the surface of the semiconductor wafers.

FIG. 1 shows a conventional vertical heat treatment apparatus, which has an improved structure for supplying a reaction gas to the wafers so that the film quality can be uniform (see Semicon NEWS, May, 1989, pages 34 to 40). The vertical heat treatment apparatus comprises a reaction furnace having a double tube made up of an outer tube 11 and an inner tube 10 included therein, and a heater 12 arranged around the double tube. The reaction furnace is substantially vertically arranged and surrounded by a heat insulating member 13. A wafer board 15 is arranged in the inner tube 10. A plurality of semiconductor wafers 14 are horizontally supported on the wafer board 15 at regular intervals. The wafer boat 15 is mounted on a turntable 16 connected to a rotational driving means which is provided outside the reaction furnace, and can be moved up and down together with the rotational driving means by a conveying means (not shown).

The inner tube 10 includes a first gas supply tube 17 having a double-tube structure, in which an inner gas supply tube 17b is inserted in an outer gas supply tube 17a. A second gas supply tube 18 is arranged between the inner and outer tubes 10 and 11. The inner gas supply tube 17b has a number of gas supplying nozzles 19 at an end portion thereof in a region corresponding to the length of the wafer boat 15, and communicates with the inner tube 10 at the end portion. The other end of the inner gas supply tube 17b communicates with a gas supply source provided outside the reaction furnace. An end of the outer gas supply tube 17a communicates with the second gas supply tube 18 through the wall of the inner tube 10. The other end of the outer gas supply tube 17a communicates with the gas exhaust source. The other end of the second gas supply tube 18 communicates with a gas supply tube provided outside the reaction furnace. In general, a reaction gas is allowed to flow through the inner gas supply tube 17b, and a coolant gas introduced from the second gas supply tube 18 is allowed to flow through the outer gas supply tube 17b. The coolant gas prevents a reaction product generated by heating the reaction gas from adhering to the inner gas supply tube 17b and the gas supplying nozzles 19, when gas of a material having a low heat-decomposition point is used as a reaction gas.

An exhaust tube 20 is arranged on the opposite side of the first and second gas supply tube 17 and 18. The exhaust tube 20 has a number of gas exhaust ports 21 at an end portion thereof in a region corresponding to the length of the wafer boat 15, and communicates with the inner tube 10 at the portion. The other end of the exhaust tube 20 communicates with an exhaust means provided outside the reaction furnace.

In the above-mentioned heat treatment apparatus, Si epitaxial growth films are formed on the wafers 14 as follows. First, the reaction furnace is heated by heater 12 to a processing temperature, 800° to 1100° C. Then, a reaction gas, $SiH_2Cl_2$ gas is introduced from the inner gas supply tube 17b via the gas supplying nozzles 19 to the inner tube 10. At the same time, a coolant gas, or $H_2$ gas, is introduced from the second gas supply tube 18 to cool the inner gas supply tube 17b, and exhausted from the outer gas supply tube 17a.

The $SiH_2Cl_2$ gas introduced in the inner tube 10 is allowed to flow among wafers 14 along the major surface of the wafers in one direction, and is finally exhausted through the exhaust ports 21 outside the furnace. Thus, Si epitaxial growth films are formed on the wafers 14.

However, the above heat treatment apparatus has the following drawbacks. First, since the gas supply tube 17 is arranged in a high temperature region of the inner tube 10 of the reaction furnace, a coolant gas cannot sufficiently cool the reaction gas to prevent deposition of Si, with the result that Si inevitably adheres to the inner gas supply tube 17b and the gas supplying nozzles 19.

Second, in a heat treatment apparatus in general, the lower portion of the reaction furnace has a relatively low temperature, since it is cooled when the wafer boat is loaded into the furnace. Hence, Si may choke the gas supplying nozzles 19 in the upper portion or narrow gas passages thereof. In addition, the amount of Si adhered to the gas supplying nozzles varies depending on the positions of the nozzles. Accordingly, the amount of the reaction gas blown through the gas supplying nozzles varies depending on the positions of the nozzles. In other words, a larger amount of the reaction gas is supplied to the wafers in the upper portion of the reaction furnace, and a smaller amount thereof to the wafers in the lower portion. Therefore, the thin film formed on each wafer in one processing lot has different thicknesses.

Further, when the reaction furnace is heated with Si adhered to the inner gas supply tube 17b, since the material of the inner gas supply tube 17b (quartz) and Si have different heat expansion coefficients, stress is applied to the inner gas supply tube 17b, resulting in breakage thereof.

Furthermore, since the first gas supply tube 17 has a double tube structure, it is difficult to clean it or exchange it with a new one in a case of breakage. Thus, maintenance of the apparatus is very troublesome.

As has been described above, the conventional heat treatment apparatus has various drawbacks and cannot easily form thin films having uniform thickness with respect to each wafer, and improvement thereof has been strongly desired.

SUMMARY OF THE INVENTION

Accordingly, a first object of the present invention is to provide a heat treatment apparatus which can satisfactorily prevent a decomposition product from adhering to the inside thereof while forming thin films having uniform thickness on a number of objects.

A second object of the present invention is to provide a method of forming a thin film by using a heat treatment apparatus which can satisfactorily prevent a decomposition product from adhering to the inside thereof while forming thin films having uniform thickness on a number of objects.

The first object is achieved by a heat treatment apparatus comprising a reaction furnace including a reaction chamber for accommodating a plurality of objects, major surfaces of which are faced to each other at intervals, and a heater provided outside the reaction chamber, gas supply means for introducing a gas into the reaction chamber therethrough, flow-directing means for directing gas flow in a first direction substantially parallel to the surfaces of the objects, gas exhaust means for exhausting a gas outside the reaction chamber, and moving means for moving the gas flow in a second direction different from the first direction.

The second object is achieved by a method of forming thin films on objects of heat treatment comprising the steps of causing a first gas flow introduced from a first gas supply means and a second gas flow introduced from a second gas supply means to meet each other, thereby producing a third gas flow flowing in a first direction substantially parallel to the surfaces of the objects, major surfaces of which are faced to each other at intervals, held in a reaction chamber, and controlling flow rates of the first and second gas flows, thereby moving the position of the third gas flow in a second direction different from the first direction.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a schematic view showing a heat treatment apparatus according to an embodiment of the present invention;

FIGS. 5A and 5B are schematic views showing positions at which gas flows meet each other;

DETAILED DESCRIPTION OF THE PREFERRED EMBODIMENTS

Figure 1:
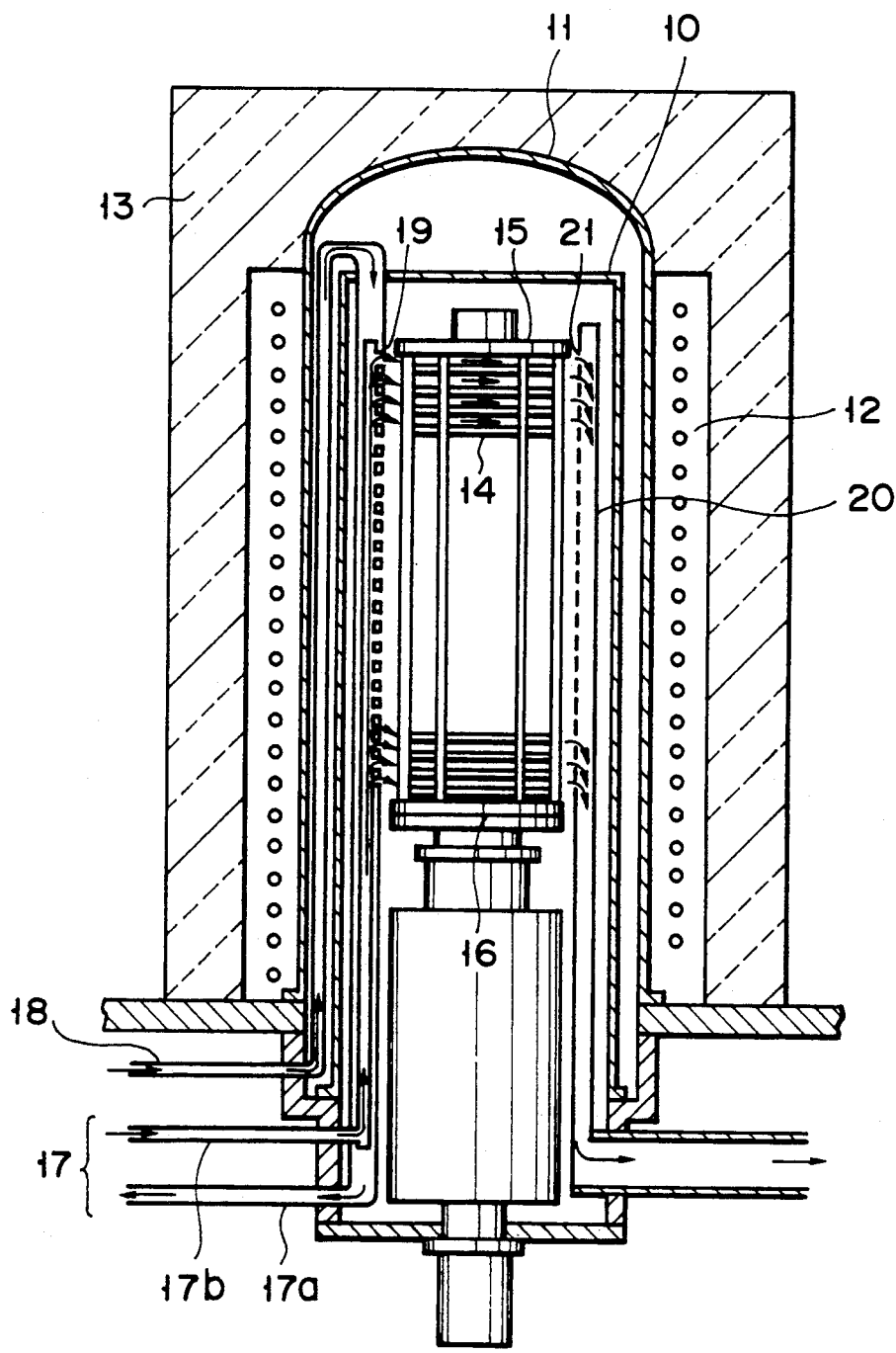
FIG. 1 is a schematic view showing a conventional heat treatment apparatus.

An embodiment of the present invention will now be described with reference to accompanying drawings.

FIG. 2 shows an embodiment of the structure of the heat treatment apparatus of the present invention. A heater 36 is provided outside a reaction tube 35 used as a reaction chamber, thereby constituting a reaction furnace. The reaction tube 35 is made of quartz and the like. The heater 36 may be a coil-like resistance heater, a high-frequency coil, or an infrared heating lamp. The reaction furnace is surrounded by a heat insulating member 22. The reaction tube 35 and the heat insulating member 22 are supported by a supporting table 23. The lower surface of the supporting table 23 is in contact with the upper end surface of a manifold 24. L-shaped first gas exhaust tube 25 and first gas supply tube 26 are arranged into the reaction tube 35 through the side wall of the manifold 24. The first gas supply tube 26 has a double-tube structure composed of an outer gas supply tube 26a and an inner gas supply tube 26b inserted therein. The first gas supply tube 26 and the first gas exhaust tube 25 are positioned in the lower portion, i.e. outside the high temperature region of the reaction chamber.

A flange 27 is in contact with the lower end surface of the manifold 24 to support it. A supporting shaft 28 of a rotational driving means is inserted in the manifold 24 through the central portion of the flange 27. The supporting shaft 28 also supports a heat-insulating cylinder 29, on which a turntable 30 is disposed. A wafer boat 31 is mounted on the turntable 30, in which a plurality of semiconductor wafers 32 are stacked at regular intervals in the vertical direction. The wafer boat 31 can hold 25 to 100 eight-inch semiconductor wafers or 50 to 150 six-inch semiconductor wafers. The distance between two adjacent semiconductor wafers 32 held by the wafer boat 31 is 5 to 12 mm in a case of eight-inch wafers, and 4 to 10 mm in a case of six-inch wafers. The wafer boat 31 can be moved up and down together with a rotational driving means by a conveying means (not shown). The wafer boat 31 is made of quartz and the like.

A second gas supply tube 33 and a second gas exhaust tube 34 are inserted into the reaction chamber through the top surface of the reaction tube 35. The openings of the second gas supply tube 33 and the second gas exhaust tube 34 respectively oppose the openings of the first gas supply tube 26 and the first gas exhaust tube 25.

Figure 3:
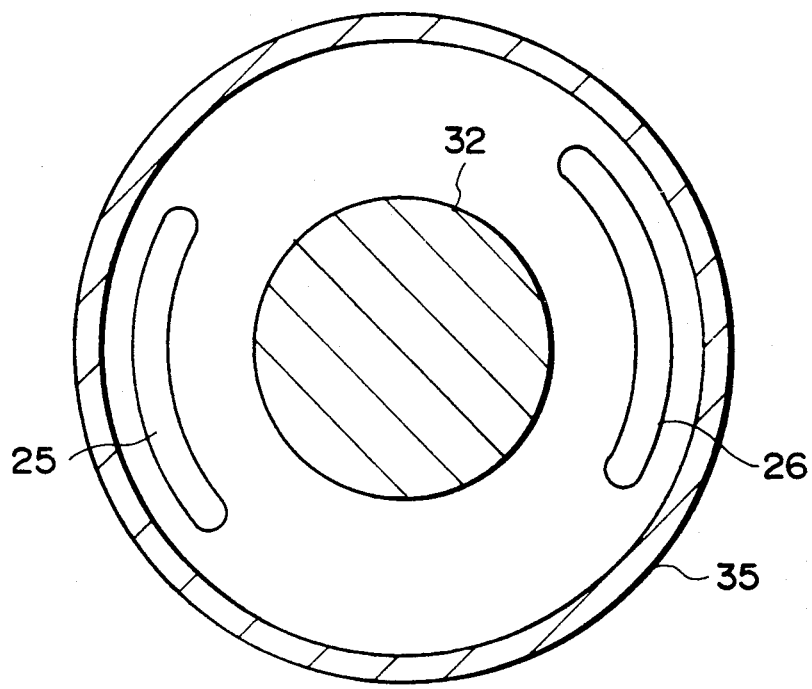
FIG. 3 is a cross sectional view of the exhausting tube of the heat treatment apparatus according to the embodiment of the present invention.

A reaction gas and a carrier gas surrounding it, which are introduced upward in a vertical direction from the first gas supply tube 26, meet a carrier gas, which is introduced downward in a vertical direction from the second gas supply tube 33, at a predetermined position in the reaction tube 35 by controlling a gas flow rate. Upon meeting, the reaction gas is diffused and flows in a direction substantially parallel to the surfaces of the semiconductor wafers 32. At this time, the flow rates of the gas exhausted through the first and second exhaust tubes 25 and 34 are controlled so that the diffused reaction gas can uniformly pass among the semiconductor wafers 32. The second gas supply tube 33 and the second gas exhaust tube 34 are positioned outside the high temperature region of the reaction chamber. If the cross sections of the second gas supply tube and exhaust tube 33 and 34 have such configurations as shown in FIG. 3, the reaction gas can be supplied efficiently in a direction substantially parallel to the surfaces of the semiconductor wafers 32, and also efficient gas exhaustion can be achieved. Further, flow rate control means (not shown) are respectively connected to the first and second gas supply tubes 26 and 33 and the first and second gas exhaust tubes 25 and 34, to control the amounts of a reaction gas introduced and exhaust gas. The flow rate control means connected to the first and second gas supplying tubes 26 and 33 control the position at which the gases introduced from the tubes 26 and 33 meet each other.

The heater 36 consists of, for example, three zones, i.e. upper, middle, and lower zones, each connected to a power supply means (not shown), so that the temperature of each zone can be independently controlled.

An operation of the above-described heat treatment apparatus will now be described. First, the reaction tube 35 is preparatorily heated to about 800° C. Then, the wafer boat 31 holding the semiconductor wafers 32 is loaded into the reaction tube 35 through the opening of the reaction tube 35 by conveying means such as a boat elevator.

Figure 4:
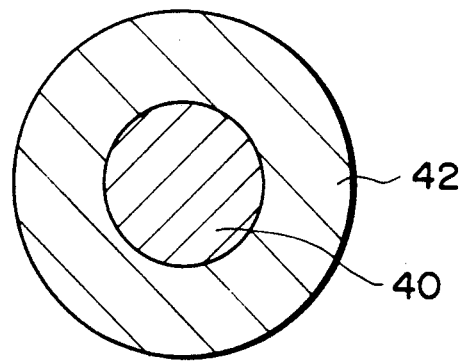
FIG. 4 is a cross sectional view of gas flow introduced through the gas supply tube having a double-tube structure of the heat treatment apparatus according to the embodiment of the present invention.

Next, the reaction tube 35 is heated or preheated to 1050° C., for example. A reaction gas having a low heat-decomposition point such as $SiCl_4$, $H_2$, HCl, or TEOS gas is introduced through the inner gas supply tube 26b of the first gas supply tube 26 into the reaction tube 35. An inert gas such as $H_2$ is introduced as a carrier gas through the outer gas supply tube 26a of the first gas supply tube. FIG. 4 shows the cross section of gas flow introduced through the first gas supply tube 26. In FIG. 4, reference numeral 40 denotes a reaction gas, and 42 a carrier gas. Since the reaction gas is surrounded by the carrier gas 42 until it meets the carrier gas introduced through the second gas supply tube 33, heat decomposition does not occur in regions other than the meeting position. As a result, deposition of a decomposition product is suppressed, and a thin film can be formed efficiently. In addition, no decomposition product is adhered to the first and second gas supply tubes 26 and 33 and the first and second exhaust tubes 25 and 34, resulting in easy maintenance of the apparatus.

A carrier gas such as $H_2$ is introduced through the second gas supply tube 33 into the reaction tube 35 and serves to cool the interior of the apparatus.

In introducing the gases, first, as shown in FIG. 5A, the flow rates of the gases are controlled so that the flow rate of the gas introduced from the first gas supply tube 26 is higher than that of the gas introduced from the second gas supply tube 33. As a result, the gases supplied from the tubes 26 and 33 meet each other in an upper portion of the reaction tube 35. In other words, the position from which the direction of the flow of the reaction gas is changed is set to an upper portion of the reaction tube 35. Hence, the semiconductor wafers 31 disposed in an upper portion of the wafer boat 31 are processed prior to those in the other portion. At this time, the exhaust means is controlled so that the flow rate of the gas exhausted from the second exhaust tube 34, so that the direction of the flow of the reaction gas is kept substantially parallel to the surfaces of the semiconductor wafers.

Figure 5B:
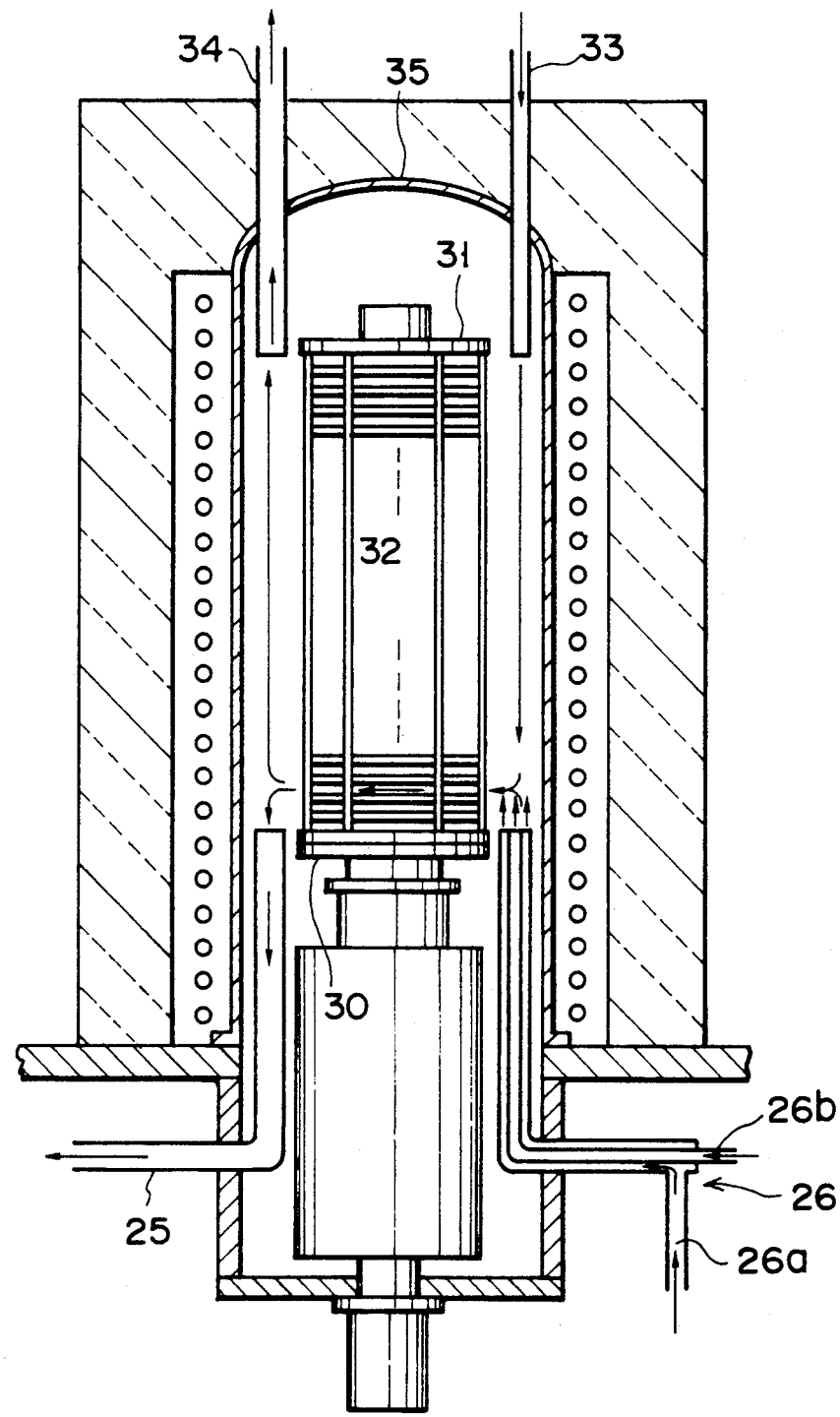

Subsequently, as shown in FIG. 5B, the flow rate of the gas introduced from the first gas supply tube 26 is gradually decreased, and that of the gas introduced from the second gas supply tube 33 is gradually increased, thereby moving the meeting position downward. Thus, all of the semiconductor wafers 32 disposed in the wafer boat 31 are processed. The amount of gas exhausted from the first and second gas exhaust tubes 25 and 34 are controlled by the exhaust means in accordance with the change of the meeting position, so as to maintain the internal pressure of the reaction tube 35 within a range from 0.2 to 10 Torr.

During the above-mentioned processing, the turntable 30 is rotated, thereby rotating the wafer boat 31 at least once. The rotation speed must be as low as possible to suppress generation of particles.

In the manner as described above, all of the semiconductor wafers disposed in the wafer boat 31 are processed uniformly.

Figure 6:
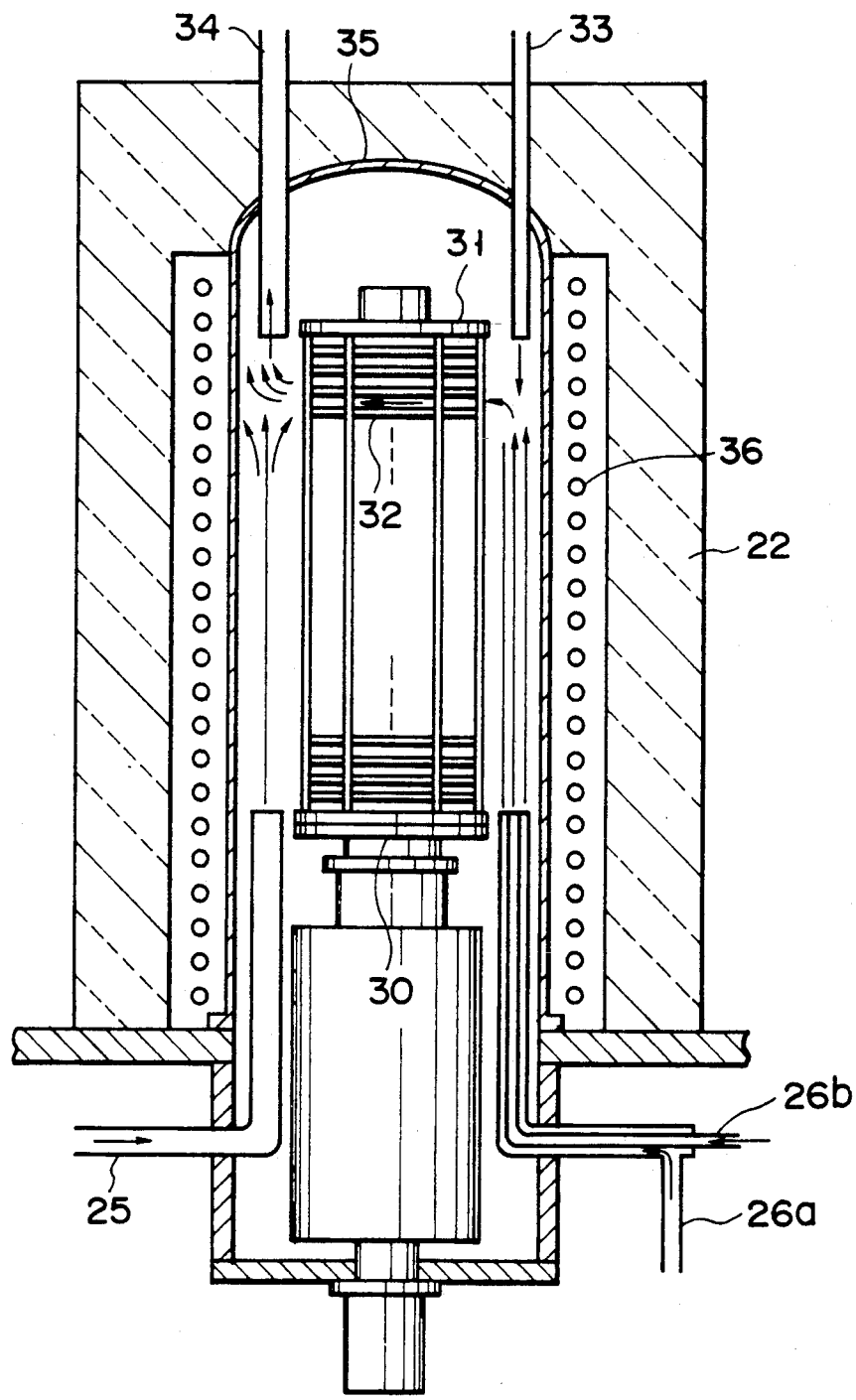
FIGS. 6 and 7 are schematic views showing heat treatment apparatuses according to other embodiments of the present invention.

In a case where thicker films should be formed on the semiconductor wafers in the upper portion of the wafer boat 31 than in the lower portion thereof, the second exhaust tube 34 exhausts the inside gas while the first exhaust tube 25 introduces a carrier gas, as shown in FIG. 6. In contrast, in a case where thicker films should be formed on the semiconductor wafers in the lower portion of the wafer boat 31, the first exhaust tube 25 exhausts the inside gas while the second exhaust tube introduces a carrier gas.

Figure 7:
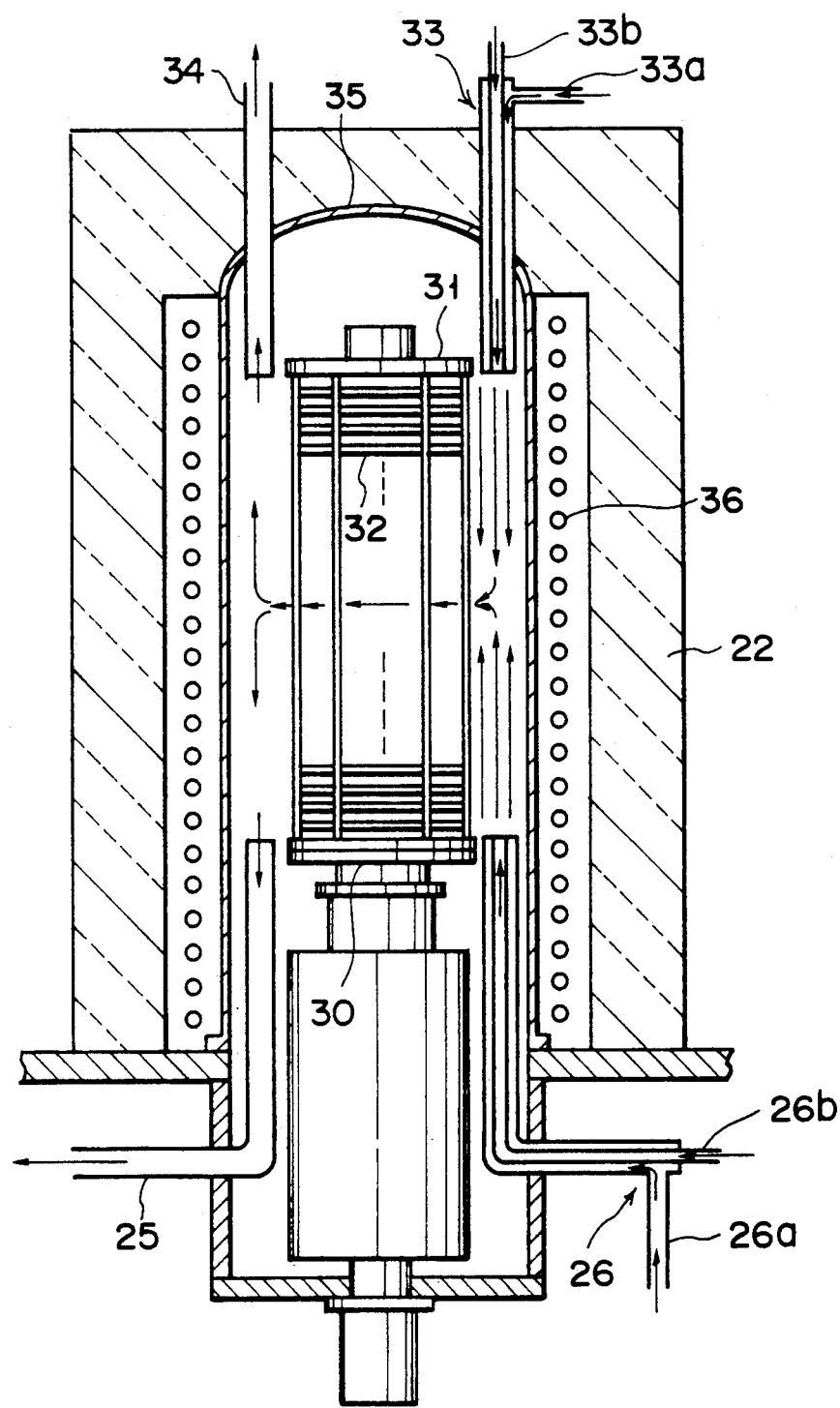

In the above embodiment, the reaction gas is introduced only from the first gas supply tube 26. However, to form thin films with higher accuracy, the second gas supply tube 33 may have a double tube structure like the first gas supply tube 26, as shown in FIG. 7. A carrier gas is introduced through the outer gas introduction tube 33a, and a reaction gas through the inner gas supply tube 33b.

Figure 8:
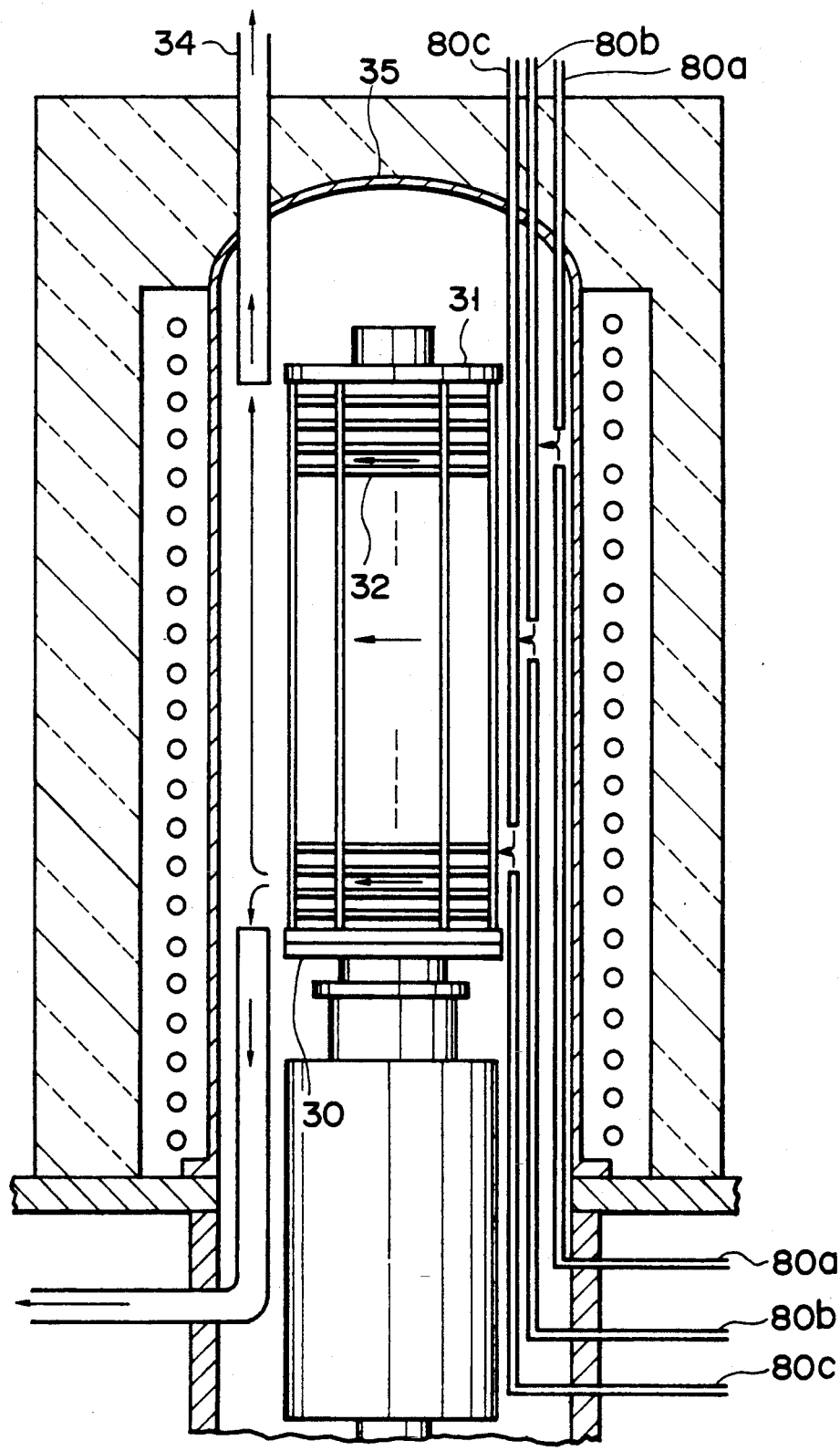
FIG. 8 is an enlarged schematic view showing a heat treatment apparatus according to still another embodiment of the present invention.

Also, in the above embodiment, the flow rates of the gases introduced from the first and second gas supply tubes 26 and 33 are controlled. However, the flow intensity thereof may be controlled. Otherwise, the flow rate or the flow intensity of the gas introduced from one of the gas supply tubes may be kept constant, while that of the other gas supply tube is controlled. Moreover, as shown in FIG. 8, gas supply tube pairs 80a to 80c are provided in the reaction tube 35, so that gases supplied through these tube pairs meet in different regions. In this case, one of paired gas supply tubes has a double tube structure like the first gas supply tube 26.

Further, the present invention is applied to a vertical type heat treatment apparatus in the above embodiment, it can be applied to a lateral type heat treatment apparatus.

An experiment wi now be described, in which Si epitaxial growth films were formed with the abovedescribed heat treatment apparatus.

First, a wafer boat holding 50 semiconductor wafers at intervals of about 5 mm (3/16 inch) was disposed in a reaction tube. Then, the reaction tube was heated to a process temperature, 1050° C. $SiH_2Cl_2$ gas at an average flow rate of 0.8 sccm/min, $PH_3$ gas at an average flow rate of 0.1 sccm/min, and $H_2$ gas at an average flow rate of 20 sccm/min were introduced as a reaction gas into the reaction tube through the inner gas supply tube of the first gas supply tube. $H_2$ gas was introduced at an average flow rate of 10 sccm/min as a carrier gas into the reaction tube through the outer gas supply tube of the first gas supply tube. $H_2$ gas was introduced at an average flow rate of 10 sccm/min as a carrier gas into the reaction tube through the second gas supply tube. The gas introduced through the first gas supply tube met the gas introduced through the second gas supply tube at an upper portion of the reaction tube. Then, the flow rate of the gas introduced through the first gas supply tube was gradually decreased, and that of the gas introduced through the second gas supply tube was gradually increased, thereby moving the meeting position of the gases downward. As a result, all of the semiconductor wafers were processed. The exhaust rates of the gas exhausted through the first and second gas exhaust tubes were controlled in accordance with the change of the meeting position. During the process, the turntable was rotated, thereby rotating the wafer boat once.

As a result, an Si epitaxial growth film was grown at a rate of 0.2 $\mu$m/min. The thickness variance of the 20 semiconductor wafers was very small, i.e. $\pm 7\%$ or less.

Although the heat treatment apparatus of the present invention is applied to formation of an Si epitaxial growth film in the above embodiment, it can be applied to formation of a WSi (tungsten silicide) film, or to a Me-CVD (metal CVD) method.

As has been described above, according to the present invention, a reaction gas can be allowed to flow in a direction parallel to the surfaces of semiconductor wafers, and the gas flow can be moved upward and downward. As a result, uniform thin films can be formed on all of the semiconductor wafers held in a wafer boat. More specifically, the flow is generated by respectively introducing a reaction gas and a carrier gas from the bottom side and the top side of the apparatus, and causing these gases to meet each other. Hence, the reaction gas can be supplied uniformly to the semiconductor wafers in one direction In addition, since the gas supply and exhaust tubes can be positioned in a region other than the high temperature region of the reaction chamber, no decomposition product is adhered to the gas supply and exhaust tubes. Thus, thin films can be formed efficiently on semiconductor wafers.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A heat treatment apparatus for coating objects having substantially parallel planar surfaces, comprising:
    a reaction furnace including a reaction chamber for accommodating a plurality of objects being arranged parallel to each other at intervals, and a heater provided outside said reaction chamber;
    a pair of gas supply means for introducing a gas into said reaction chamber, said gas supply means being placed apart from each other in a substantially perpendicular direction to each surface of said objects, said gas supply means having gas-flow discharge portions arranged in said reaction chamber so as to face each other;
    gas supply controlling means for controlling the flow rate of a gas introduced from said gas supply means; and means for exhausting a gas from said reaction chamber.

2. A heat treatment apparatus according to claim 1, including a plurality of said pairs of gas supply means arranged such that locations of the respective gas-flow discharge portions of said plurality of gas supply means differ from each other.

3. A heat treatment apparatus according to claim 1 further comprising a mechanism for rotating said objects in said reaction chamber.

4. A heat treatment apparatus according to claim 1, wherein the reaction chamber is a vertical reaction diameter and accommodates a plurality of said objects at vertical intervals.

5. A heat treatment apparatus for coating objects having substantially parallel planar surfaces comprising:
    a reaction furnace including a reaction chamber for accommodating a plurality of objects being arranged parallel to each other at intervals, and a heater provided outside said reaction chamber;
    a pair of gas supply means for introducing a gas into said reaction chamber, said gas supply means being placed apart from each other in a substantially perpendicular direction to each planar surface of said objects, said gas supply means having gas flow discharge portions arranged in said reaction chamber so as to face each other;
    gas supply control means for controlling the flow rate of a gas introduced from said ga supply means;
    a pair of means for exhausting a gas used for treating said objects in said reaction chamber, said exhausting means being placed apart from each other in a substantially perpendicular direction to each planar surface of said objects, said means having gas-flow discharge portions arranged in said reaction chamber so as to face each other; and
    gas exhaust control means for controlling the exhaust flow of a gas in said reaction chamber,
    wherein gas flows are introduced from said gas supply means in the substantially perpendicular direction to each planar surface of said objects; and
    said gas flows collide with each other in said reaction chamber, and thereafter move in a parallel direction to each planar surface of said objects.

6. A heat treatment apparatus according to claim 5, including a plurality of said pairs of gas supply means arranged such that locations of the respective gas-flow discharge portions of said plurality of gas supply means differ from each other.

7. A heat treatment apparatus according to claim 5 further comprising a mechanism for rotating said object in said reaction chamber.

8. A heat treatment apparatus according to claim 5, wherein cross-sectional shapes of said gas-flow discharge portions of said gas supply means and said gas exhaust means have a longer-side to shorter-side ratio in a range of 2:1 to 10:1.

9. A heat treatment apparatus for coating objects having substantially parallel planar surfaces, comprising:
    a reaction furnace including a reaction chamber for accommodating a plurality of objects being arranged at intervals, and a heater provided outside said reaction chamber;
    a pair of gas supply means having a double-tube structure for introducing a gas into said reaction chamber, said gas supply means being placed apart from each other in a substantially perpendicular direction to each planar surface of said objects, said gas supply means having gas flow discharge portions arranged in said reaction chamber so as to face each other;

gas-supply control means for controlling the flow rate of a gas introduced from said gas supply means;

a pair of means for exhausting a gas used for treating said objects in said reaction chamber, said exhausting means being placed apart from each other in a substantially perpendicular vertical direction to each planar surface of said objects, said means having gas-flow discharge portions arranged in said reaction chamber so as to face each other; and gas-exhaust control means for controlling the exhaust flow of a gas in said reaction chamber, wherein a carrier gas is introduced into an outer tube of said gas supply means; a reaction gas is introduced into an inner tube of said gas supply means; and the gas flows being introduced from said gas supply means in the substantially perpendicular direction to each planar surface of said objects collide with each other in said reaction chamber, and thereafter the gas flows moves in a parallel direction to each planar surface of said objects.

10. A heat treatment apparatus according to claim 9, wherein the introduced gas is a reaction gas having a relatively low heat-decomposition temperature.

* * * * *